United States Patent
Wang et al.

(10) Patent No.: US 8,017,969 B2
(45) Date of Patent: *Sep. 13, 2011

(54) LED CHIP PACKAGE STRUCTURE WITH HIGH-EFFICIENCY LIGHT EMISSION BY ROUGH SURFACES AND METHOD OF MAKING THE SAME

(75) Inventors: Bily Wang, Hsinchu (TW); Shih-Yu Wu, Banciao (TW); Wen-Kuei Wu, Hukou Township, Hsinchu County (TW)

(73) Assignee: Harvatek Corporation, Hsinchu (TW)

( * ) Notice: Subject to any disclaimer, the term of this patent is extended or adjusted under 35 U.S.C. 154(b) by 281 days.

This patent is subject to a terminal disclaimer.

(21) Appl. No.: 12/232,835

(22) Filed: Sep. 25, 2008

(65) Prior Publication Data

US 2009/0152570 A1      Jun. 18, 2009

(30) Foreign Application Priority Data

Dec. 12, 2007 (TW) .................................. 96147447

(51) Int. Cl.
    *H01L 33/00* (2010.01)
(52) U.S. Cl. ............... 257/99; 257/81; 257/88; 257/92; 257/100; 257/E33.056; 257/E33.062
(58) Field of Classification Search ............... 257/81, 257/88, 92, 99, 100, E33.056, E33.062
    See application file for complete search history.

(56) References Cited

U.S. PATENT DOCUMENTS

| 6,921,926 | B2* | 7/2005 | Hsu | 257/98 |
| 7,834,365 | B2* | 11/2010 | Wang et al. | 257/88 |
| 2004/0061433 | A1* | 4/2004 | Izuno et al. | 313/498 |
| 2006/0138436 | A1* | 6/2006 | Chen et al. | 257/98 |
| 2006/0157724 | A1* | 7/2006 | Fujita | 257/99 |

* cited by examiner

*Primary Examiner* — Eugene Lee
*Assistant Examiner* — Anthony Ho
(74) *Attorney, Agent, or Firm* — Rosenberg, Klein & Lee (57) ABSTRACT

An LED chip package structure with high-efficiency light emission by rough surfaces includes a substrate unit, a light-emitting unit, and a package colloid unit. The substrate unit has a substrate body, and a positive electrode trace and a negative electrode trace respectively formed on the substrate body. The light-emitting unit has a plurality of LED chips arranged on the substrate body. Each LED chip has a positive electrode side and a negative electrode side respectively and electrically connected with the positive electrode trace and the negative electrode trace of the substrate unit. The package colloid unit has a plurality of package colloids respectively covering the LED chips. Each package colloid has a cambered colloid surface and a light-emitting colloid surface respectively formed on its top surface and a lateral surface thereof.

12 Claims, 15 Drawing Sheets

LED CHIP PACKAGE STRUCTURE WITH HIGH-EFFICIENCY LIGHT EMISSION BY ROUGH SURFACES AND METHOD OF MAKING THE SAME

BACKGROUND OF THE INVENTION

1. Field of the Invention

The present invention relates to an LED chip package structure and a method of making the same, and particularly relates to an LED chip package structure with high-efficiency light emission by rough surfaces and a method of making the same.

2. Description of the Related Art

Figure 1:
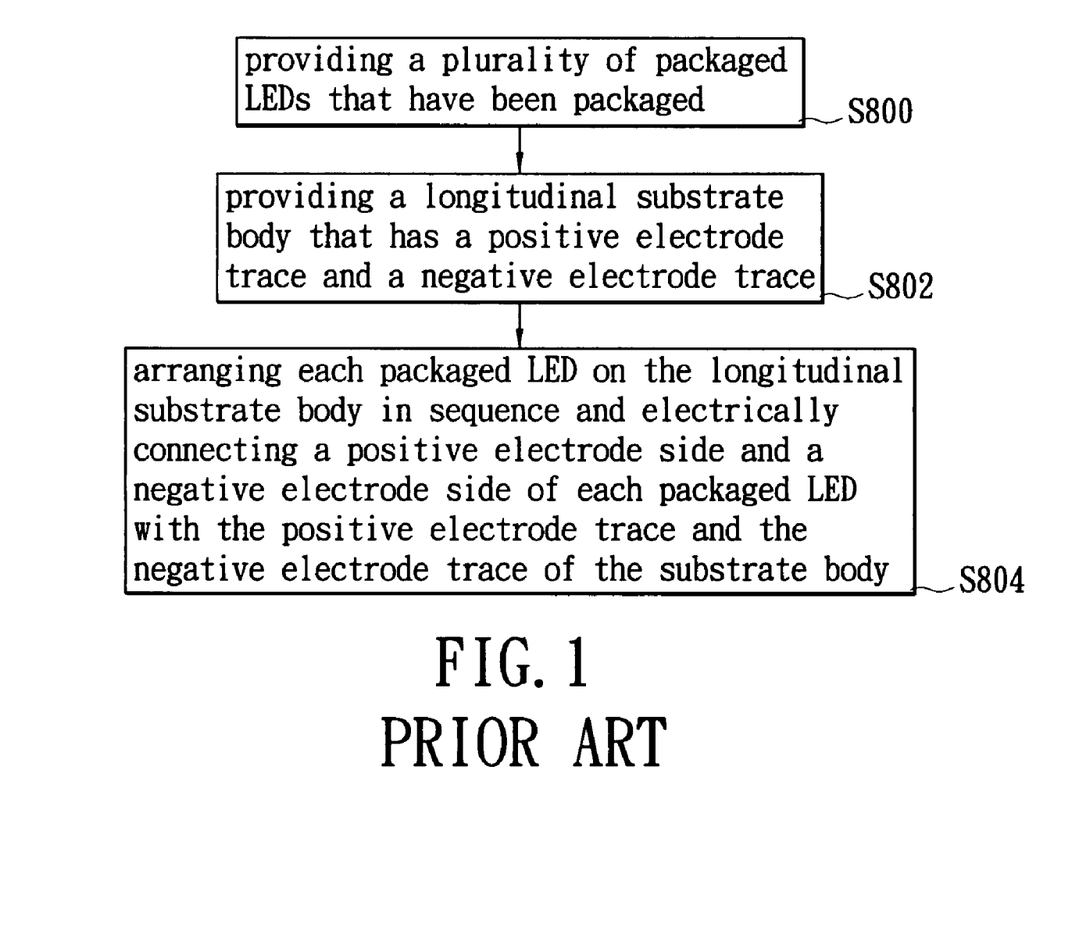
FIG. 1 is a flowchart of a first method for packaging LED chips of the prior art.

Referring to FIG. 1, a known first method for packaging LED chips is shown. The known first method includes: providing a plurality of packaged LEDs that have been packaged (S800); providing a longitudinal substrate body that has a positive electrode trace and a negative electrode trace (S802); and then, arranging each packaged LED on the longitudinal substrate body in sequence and electrically connecting a positive electrode side and a negative electrode side of each packaged LED with the positive electrode trace and the negative electrode trace of the substrate body (S804).

Figure 2:
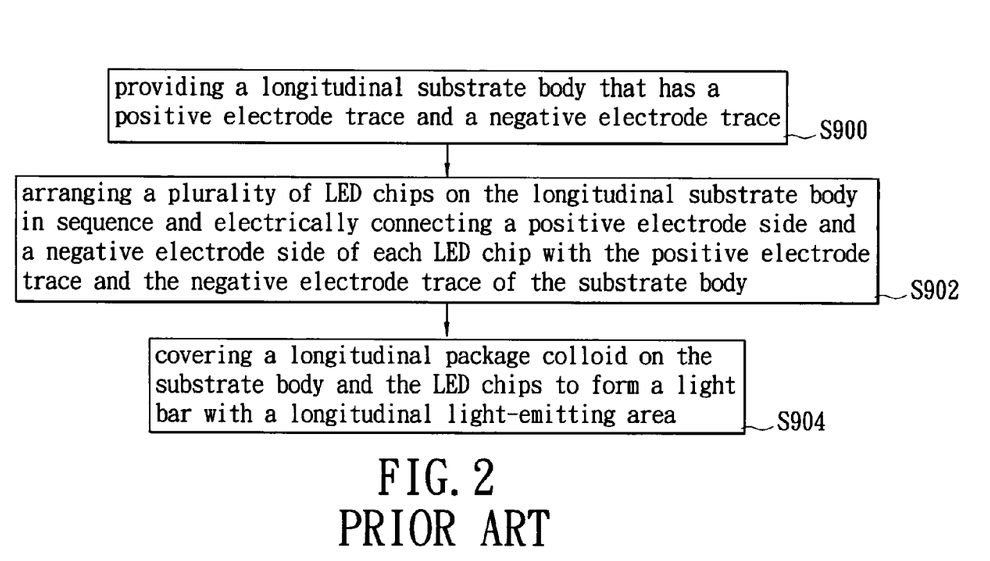
FIG. 2 is a flowchart of a second method for packaging LED chips of the prior art.

Referring to FIG. 2, a known second method for packaging LED chips is shown. The known second method includes: providing a longitudinal substrate body that has a positive electrode trace and a negative electrode trace (S900); arranging a plurality of LED chips on the longitudinal substrate body in sequence and electrically connecting a positive electrode side and a negative electrode side of each LED chip with the positive electrode trace and the negative electrode trace of the substrate body (S902); and then, covering a longitudinal package colloid on the substrate body and the LED chips to form a light bar with a longitudinal light-emitting area (S904).

However, With regards to the known first method, each packaged LED needs to be firstly cut from an entire LED package structure, and then each packaged LED is arranged on the longitudinal substrate body via SMT process. Hence, the known first packaging process is time-consuming. Moreover, because the fluorescent colloids 4a are separated from each other, a dark band is easily produced between the two fluorescent colloids 4a and the two LEDs 2a. Hence, the known LED package structure does not offer a good display for users. Moreover, because the package colloids of the packaged LEDs are separated from each other, a dark band is easily produced between each two package colloids and each two packaged LEDs. Hence, the known first LED package structure does not offer a good display for users.

With regards to the known second method, because the light bar produces the longitudinal light-emitting area, no dark band is produced. However, the triggered area of the longitudinal package colloid is not uniform, so the light-emitting efficiency of the light bar is not good. In other words, one partial package area of the longitudinal package colloid close to the LED chips generates a stronger triggered light, and the other partial package area of the longitudinal package colloid separated from the LED chips generates a weaker triggered light.

Figure 3:
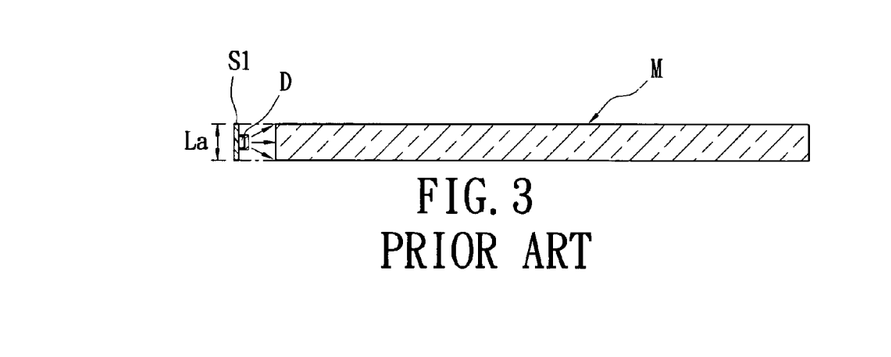
FIG. 3 is a schematic view of an LED chip package structure used to generate lateral projected light according to the prior art.

Referring to FIG. 3, an LED chip D is used to generate lateral projected light as a lateral light source that is applied to a light-guiding board M of a monitor of a notebook. Because the light-guiding board M of the monitor is very thin, a length La of a base SI needs to be shortened. In other words, the length La of the base S1 is very short, the LED chip D can not achieve good heat-dissipating effect (the length La of the base S1 is limited by the thickness of light-guiding board M). Hence, the LED chip D is damaged easily due to overheating.

SUMMARY OF THE INVENTION

The present invention provides an LED chip package structure with high-efficiency light emission by rough surfaces and a method of making the same. When the LED chip package structure of the present invention lights up, the LED chip package structure generates a series of light-generating areas on a colloid unit. Because the series of light-generating areas is continuous, no dark bands are produced between each two LED chips and no light decay in the present invention. Furthermore, because the LED chips are arranged on a substrate body via an adhesive or a hot pressing method, the process for the LED chip package structure is simple and less time is needed for the manufacturing process. Furthermore, the LED chip package structure can be applied to any type of light source such as a back light module, a decorative lamp, a lighting lamp, or a scanner.

Moreover, the LED chip package structure of the present can be used in vertical state due to the special hot pressing method. Hence, the LED chip package structure of the present invention not only has a good heat-dissipating effect, but also can be applied to a thin casing.

A first aspect of the present invention is a method of making an LED chip package structure with high-efficiency light emission by rough surfaces, including: providing a substrate unit, and the substrate unit having a substrate body, and a positive electrode trace and a negative electrode trace respectively formed on the substrate body; arranging a plurality of LED chips on the substrate body by a matrix method to form a plurality of longitudinal LED chip rows, and each LED chip having a positive electrode side and a negative electrode side respectively and electrically connected with the positive electrode trace and the negative electrode trace of the substrate unit; and longitudinally and respectively covering the longitudinal LED chip rows with a plurality of longitudinal package colloids using a first mold unit, and each longitudinal package colloid having a plurality of cambered colloid surfaces that are formed on its top side and correspond to the LED chips.

Moreover, the method further comprises two packaging processes, which can be described as follows:

The first packaging process includes: transversely cutting the longitudinal package colloids along a line between each two adjacent and longitudinal LED chips to form a plurality of package colloids that are separated from each other and respectively covering the corresponding LED chips, and the top surface of each package colloid being the cambered colloid surface; respectively covering and filling a frame unit on the substrate body, on the package colloids, and between each two adjacent package colloids using a second mold unit; and transversely cutting the frame unit, the package colloids and the substrate body along a line between each two adjacent and longitudinal LED chips to form a plurality of light bars, and each package colloid being cut into two half package colloids, each half package colloid having a half cambered colloid surface and a rough light-emitting colloid surface formed in front of its cambered colloid surface, and each light bar having a frame layer for exposing the rough light-emitting colloid surfaces of the half package colloids.

The second packaging process includes: transversely cutting the longitudinal package colloids along a line between each two adjacent and longitudinal LED chips to form a plurality of package colloids that are separated from each other and respectively covering the corresponding LED chips, and the top surface of each package colloid being the cambered colloid surface; respectively, longitudinally covering and filling a plurality of longitudinal frame layers on the substrate body, on the package colloids, and between each two longitudinal and adjacent package colloids via a third mold unit; and transversely cutting the longitudinal frame layers, the package colloids and the substrate body along a line between each two adjacent and longitudinal LED chips to form a plurality of light bars, and each package colloid being cut into two half package colloids, each half package colloid having a half cambered colloid surface and a rough light-emitting colloid surface formed in front of its cambered colloid surface, and each light bar having a frame layer for exposing the rough light-emitting colloid surfaces of the half package colloids.

A second aspect of the present invention is an LED chip package structure with high-efficiency light emission by rough surfaces. The LED chip package structure includes a substrate unit, a light-emitting unit, and a package colloid unit.

The substrate unit has a substrate body, and a positive electrode trace and a negative electrode trace respectively formed on the substrate body. The light-emitting unit has a plurality of LED chips arranged on the substrate body. Each LED chip has a positive electrode side and a negative electrode side respectively and electrically connected with the positive electrode trace and the negative electrode trace of the substrate unit. The package colloid unit has a plurality of package colloids respectively covering the LED chips. Each package colloid has a cambered colloid surface and a light-emitting colloid surface respectively formed on its top surface and a lateral surface thereof.

Moreover, the LED chip package structure further comprises two detailed structures, as follows:

The first detailed structure includes: a frame unit that is a frame layer covering the substrate body and disposed around whole lateral sides of each half package colloid for exposing the rough light-emitting colloid surfaces of the half package colloids.

The second detailed structure includes: a frame unit has a plurality of frame bodies, and each frame body covering the half package colloid for exposing each rough light-emitting surface of each half package colloid, and the frame bodies are separated from each other.

Therefore, because the series of light-generating areas is continuous, no dark bands are produced between each two LED chips and no light decay in the present invention. Furthermore, because the LED chips are arranged on a substrate body via an adhesive or a hot pressing method, the process for the LED chip package structure is simple and less time is needed for the manufacturing process. Moreover, the LED chip package structure of the present can be used in vertical state due to the special hot pressing method. Hence, the LED chip package structure of the present invention not only has a good heat-dissipating effect, but also can be applied to a thin casing.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which:

FIGS. 4A to 4F are cross-sectional diagrams of a packaging process according to the first embodiment of present invention;

FIGS. 7A to 7B are cross-sectional diagrams of a packaging process according to the second embodiment of present invention;

FIG. 8A is a cross-sectional diagrams of a packaging process according to the third embodiment of present invention.

DETAILED DESCRIPTION OF PREFERRED BEST MOLDS

Referring to FIGS. 4, 4a to 4f, and 4A to 4F, the first embodiment of the present invention provides a method for making an LED chip package structure with high-efficiency light emission by rough surfaces.

Figure 4:
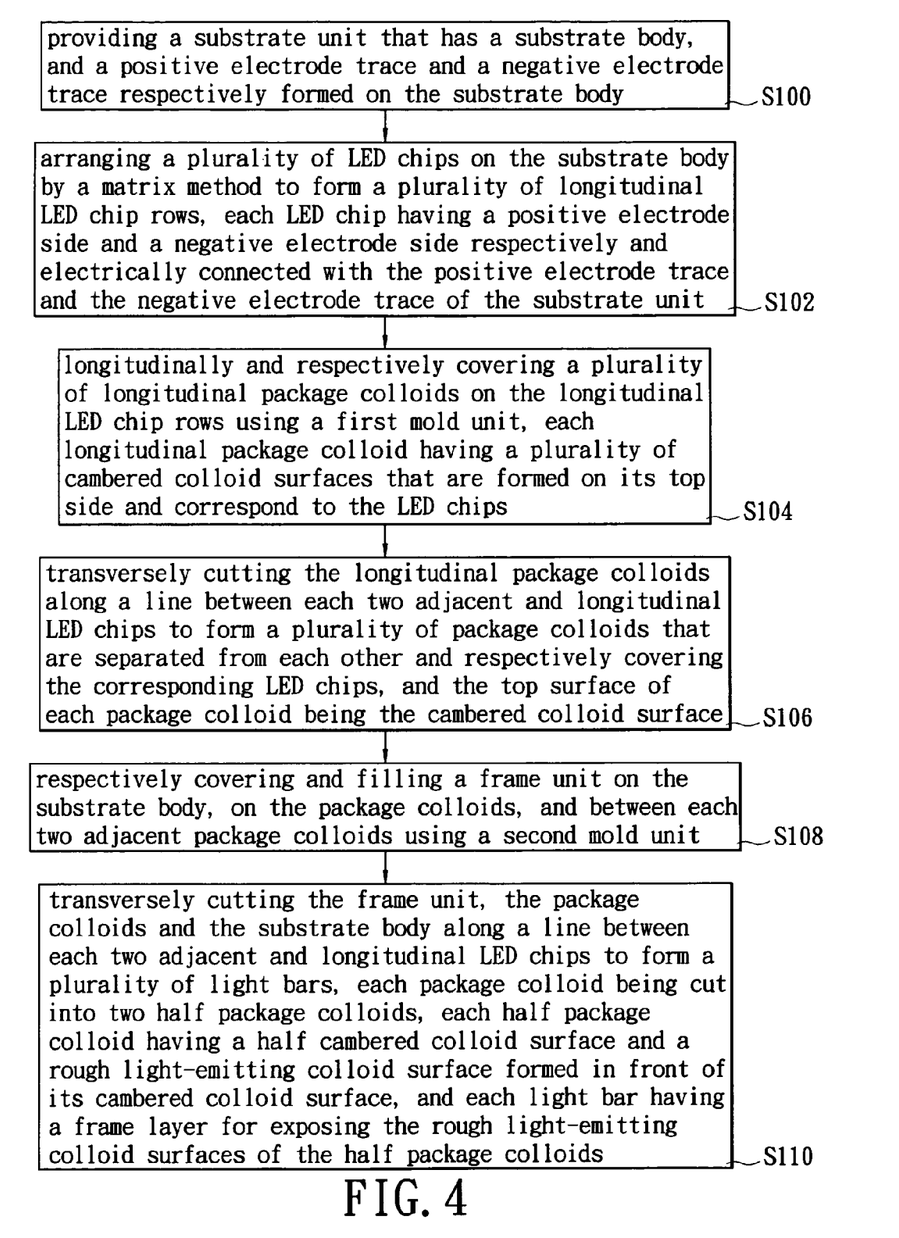
FIG. 4 is a flowchart of a method for making an LED chip package structure according to the first embodiment of present invention.
Figure 4A:
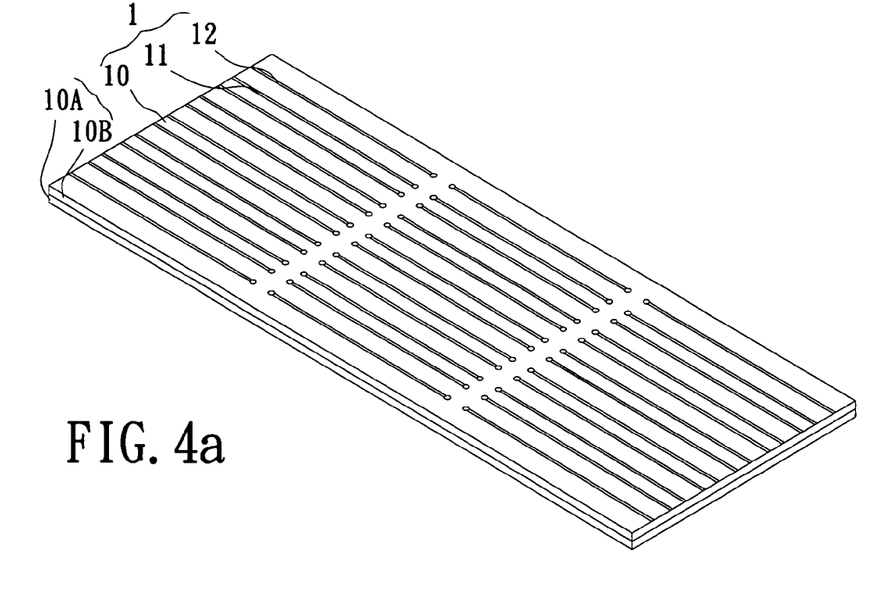
FIGS. 4a to 4f are perspective, schematic diagrams of a packaging process according to the first embodiment of present invention.

The method comprises: referring to FIGS. 4a and 4A, providing a substrate unit 1, the substrate unit having a substrate body 10, and a positive electrode trace 11 and a negative electrode trace 12 respectively formed on the substrate body 10 (S100). The substrate body 10 has a metal layer 10A and a Bakelite layer 10B formed on the metal layer 10A (as shown in FIGS. 4a and 4A). The substrate unit 1 can be a PCB (Printed Circuit Board), a flexible substrate, an aluminum substrate, a ceramic substrate, or a copper substrate. In addition, both the positive electrode trace 11 and the negative electrode trace 12 can be aluminum circuits or silver circuits. The layouts of the positive electrode trace 11 and the negative electrode trace 12 are determined by different needs.

Figure 4B:
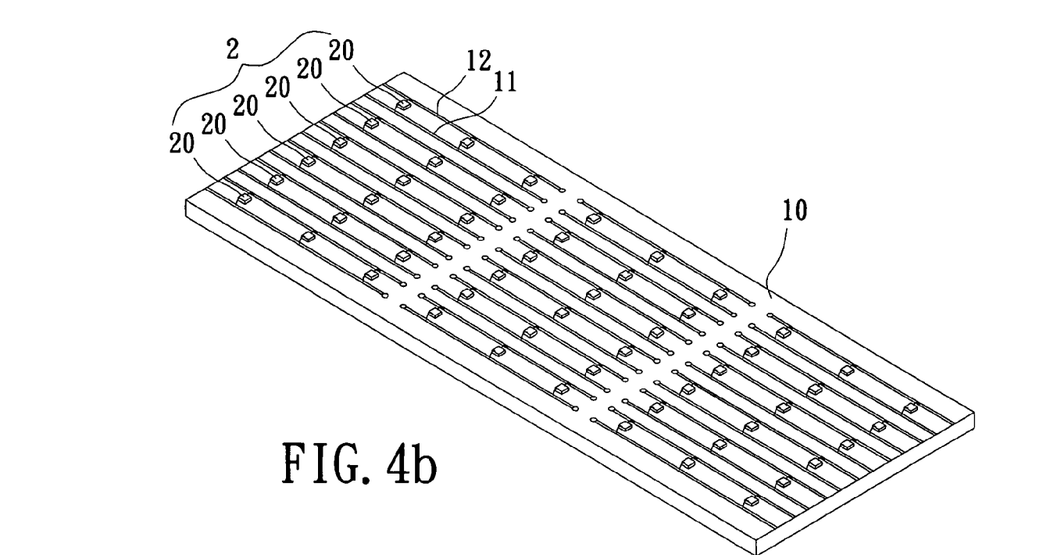

Referring to FIGS. 4b and 4B, the method of the first embodiment further comprises: arranging a plurality of LED chips 20 on the substrate body 10 by a matrix method to form a plurality of longitudinal LED chip rows 2, each LED chip 20 having a positive electrode side 201 and a negative electrode side 202 respectively and electrically connected with the positive electrode trace 11 and the negative electrode trace 12 of the substrate unit 1 (S102).

In the first embodiment, the positive electrode side 201 and the negative electrode side 202 of each LED chip 20 are respectively and electrically connected with the positive electrode trace 11 and the negative electrode trace 12 of the substrate unit 1 via two corresponding leading wires W using a wire-bounding method. Moreover, each longitudinal LED chip row 2 is straightly arranged on the substrate body 10 of the substrate unit 1. Each LED chip 20 can be a blue LED chip.

Figure 5:
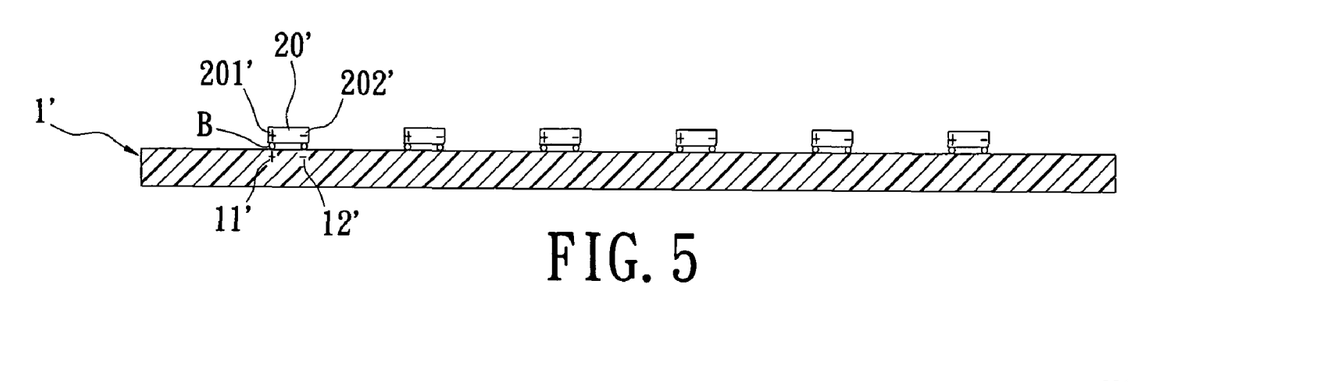
FIG. 5 is a schematic view of LED chips electrically connected on a substrate body using a flip-chip method.

However, the above-mentioned method of electrically connecting the LED chips should not be used to limit the present invention. For example, referring to FIG. 5, the positive electrode side 201' and the negative electrode side 202' of each LED chip 20' respectively and electrically connected with the positive electrode trace 11' and the negative electrode trace 12' of the substrate unit 1' via a plurality of corresponding solder balls B using a flip-chip method. Moreover, according to different needs, positive electrode sides and negative electrode sides of LED chips (not shown) can be electrically connected to a positive electrode trace and a negative electrode trace of a substrate unit (not shown) via parallel, serial, or parallel and serial method.

Figure 4C:
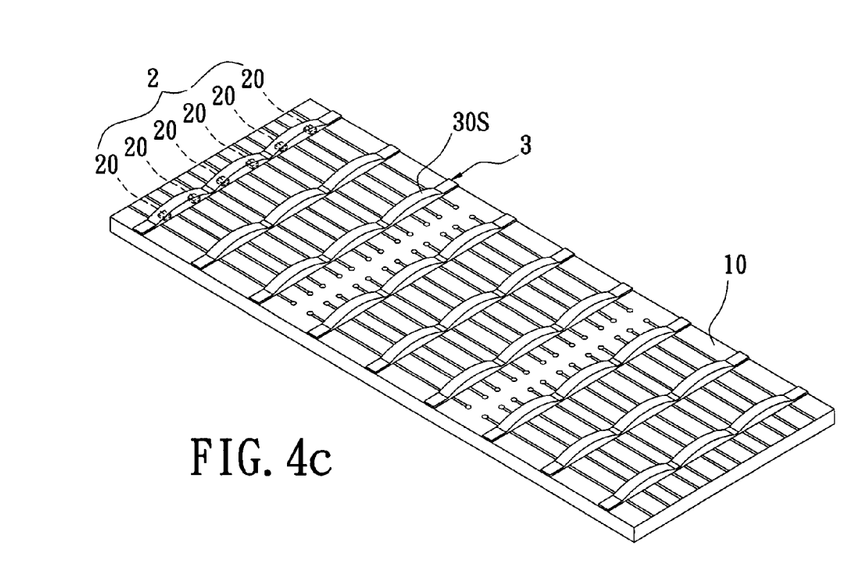
Figure 6:
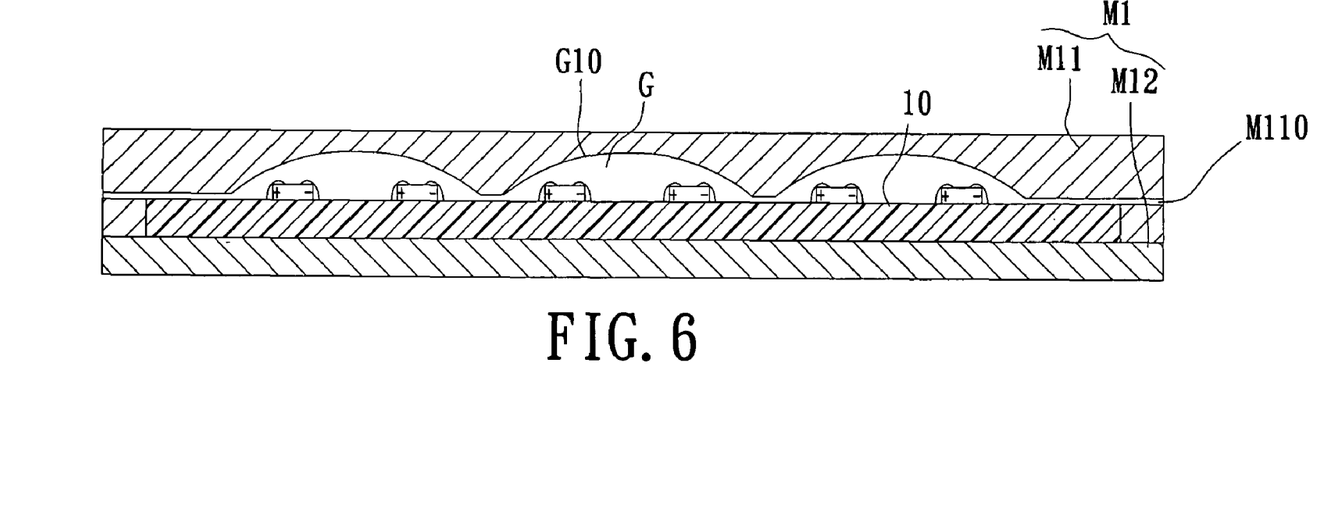
FIG. 6 is a schematic view of FIG. 4C without package colloid.

Referring to FIGS. 4c, 4C and 6, the method of the first embodiment further comprises: longitudinally and respectively covering a plurality of longitudinal package colloids 3 on the longitudinal LED chip rows 2 using a first mold unit M1, each longitudinal package colloid 3 having a plurality of cambered colloid surfaces 30S that are formed on its top side and correspond to the LED chips 20 (S104).

The first mold unit M1 is composed of a first upper mold M11 and a first lower mold M12 for supporting the substrate body 10. The first upper mold M11 has a plurality of first channels M110 corresponding to the longitudinal LED chip rows 2. Each first channel M110 has a plurality of grooves G. Each groove G has a cambered mold surface G10 that is formed on its top surface and is used to form the corresponding cambered colloid surface 30S.

Each first channel M110 has a size is the same as that of each longitudinal package colloid 3. Moreover, according to a user's needs, each longitudinal package colloid 3 can be a fluorescent resin that is formed by mixing silicone and fluorescent powders, or each longitudinal package colloid 3 can be a fluorescent resin that is formed by mixing epoxy and fluorescent powders.

Figure 4D:
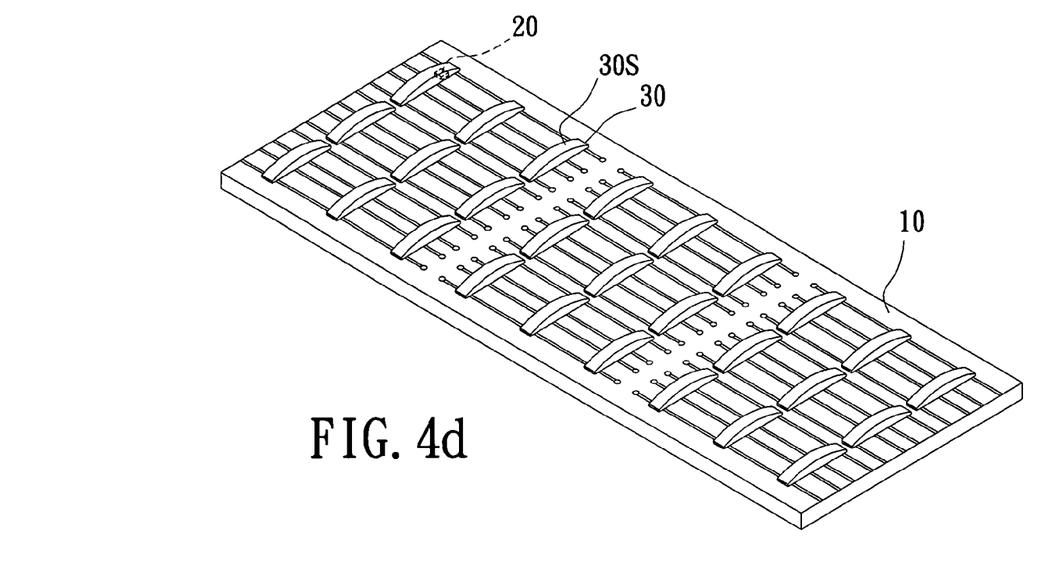

Finally, referring to FIGS. 4d and 4D, the method of the first embodiment further comprises: transversely cutting the longitudinal package colloids 3 along a line between each two adjacent and longitudinal LED chips 20 to form a plurality of package colloids 30 that are separated from each other and respectively covering the corresponding LED chips 20, and the top surface of each package colloid 30 being the cambered colloid surface 30S (S106).

Figure 4E:
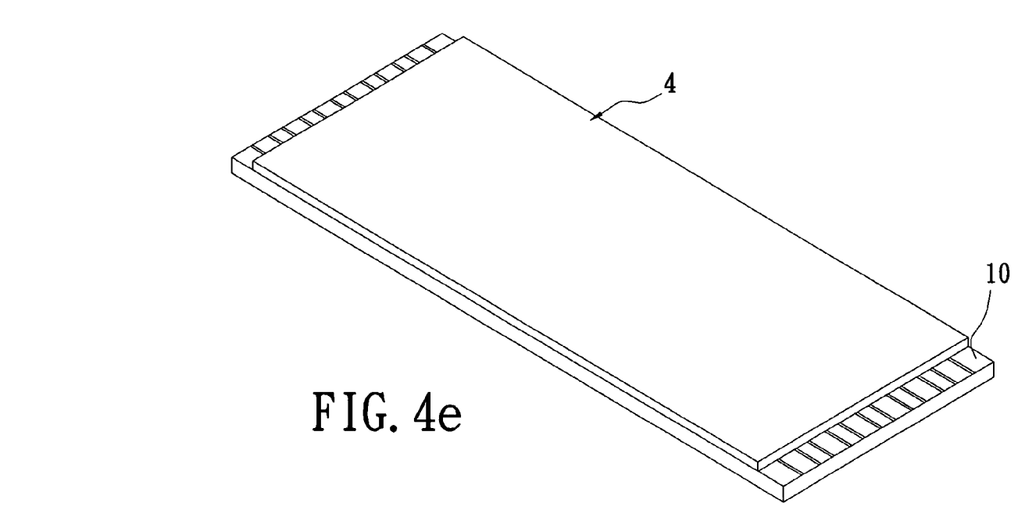

Referring to FIGS. 4e and 4E, the method of the first embodiment further comprises: respectively covering and filling a frame unit 4 on the substrate body 10, on the package colloids 30, and between each two adjacent package colloids 30 using a second mold unit M2 (S108). Moreover, the second mold unit M2 is composed of a second upper mold M21 and a second lower mold M22 for supporting the substrate body 10. The second upper mold M21 has a second channel M210 corresponding to the frame unit 4. The second channel M210 has a height the same to that of each package colloid 30 and the second channel M210 has a width the same to that of the frame unit 4.

Figure 4F:
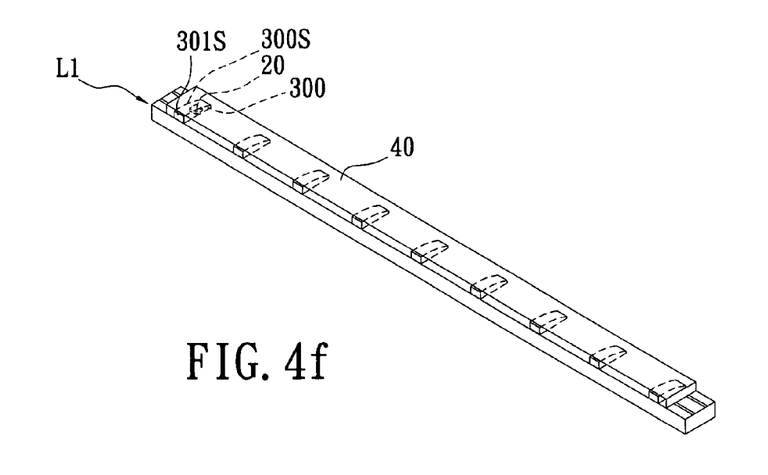

Finally, referring to FIGS. 4e, 4f, and 4F, the method of the first embodiment further comprises: transversely cutting the frame unit 4, the package colloids 30 and the substrate body 10 along a line between each two adjacent and longitudinal LED chips 20 to form a plurality of light bars L1, each package colloid 30 being cut into two half package colloids 300, each half package colloid 300 having a half cambered colloid surface 300S and a rough light-emitting colloid surface 301S formed in front of its cambered colloid surface 300S, and each light bar L1 having a frame layer 40 for exposing the rough light-emitting colloid surfaces 301S of the half package colloids 300 (S110). Moreover, the frame layer 40 can be an opaque frame layer such as a white frame layer.

Figure 7:
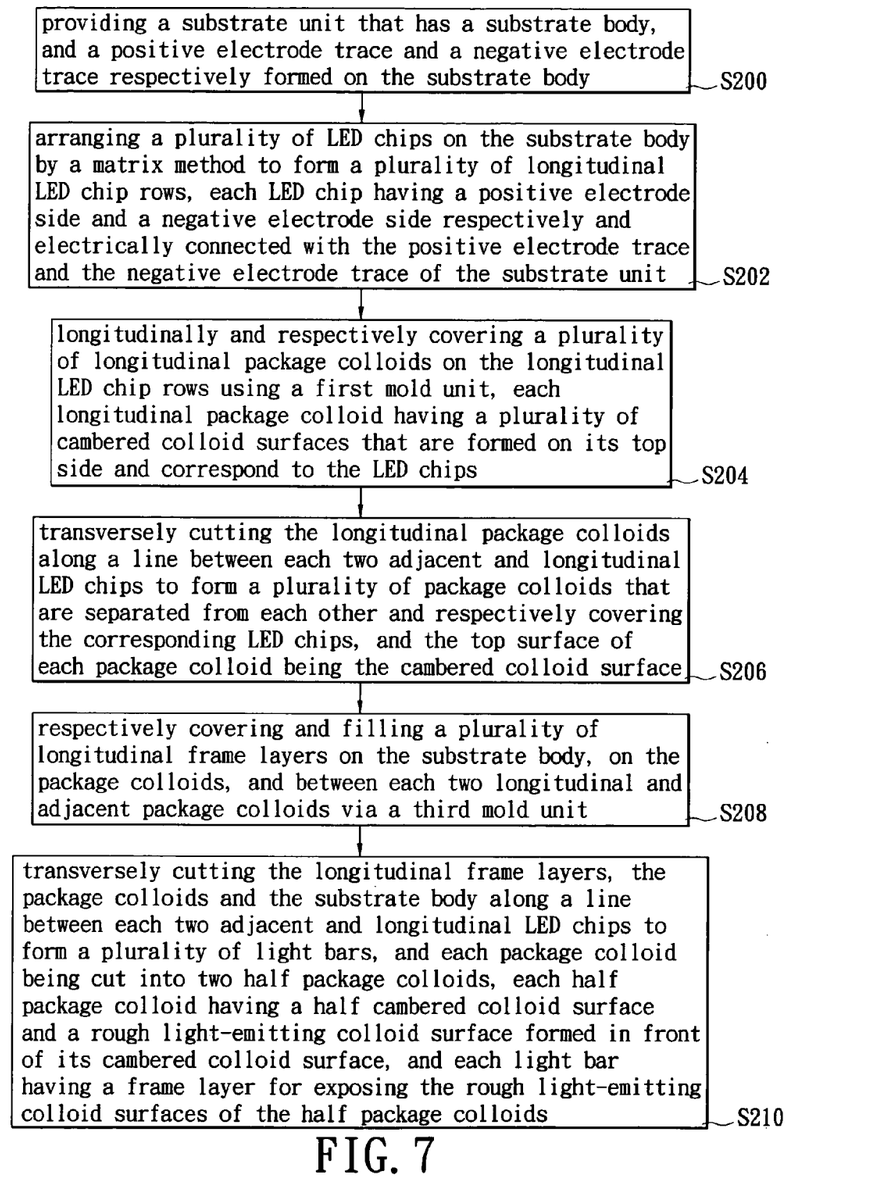
FIG. 7 is a flowchart of a method for making an LED chip package structure according to the second embodiment of present invention.
Figure 7A:
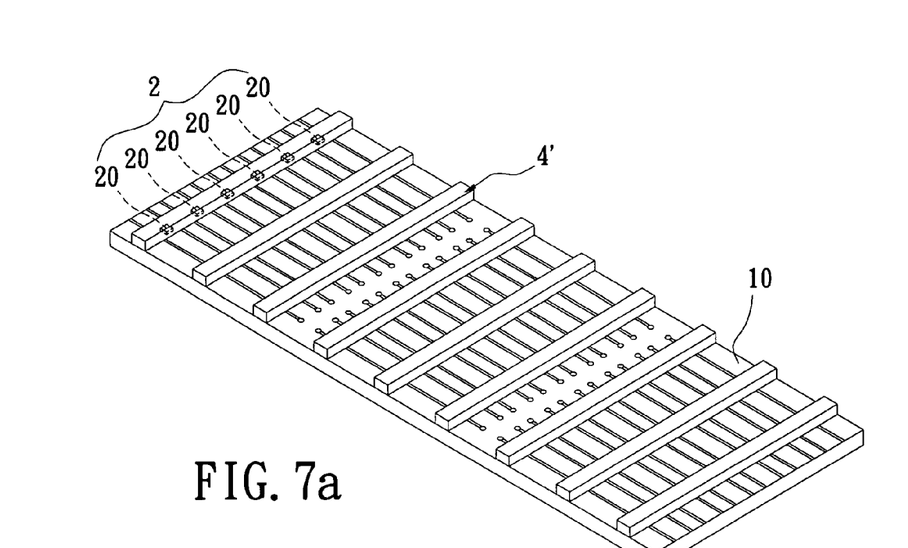
FIGS. 7a to 7b are perspective, schematic diagrams of a packaging process according to the second embodiment of present invention.
Figure 7B:
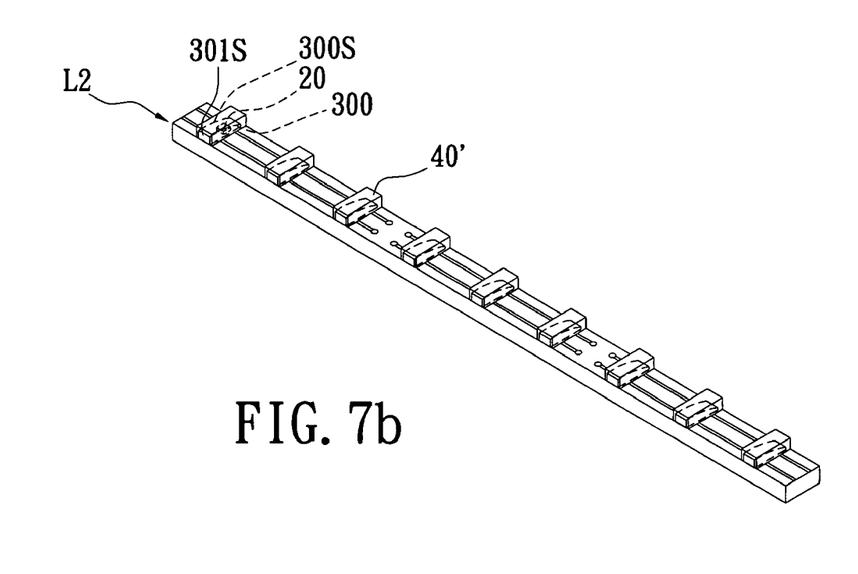

Referring to FIGS. 7, 7a to 7b, and 7A to 7B, the second embodiment of the present invention provides a method for making an LED chip package structure with high-efficiency light emission by rough surfaces. Referring to FIGS. 4 and 7, the steps S200 to S206 of the second embodiment are same to the steps S100 to S106 of the first embodiment. In other words, the illustration of S200 is the same to FIGS. 4a and 4A of the first embodiment, the illustration of S202 is the same to FIGS. 4b and 4B of the first embodiment, the illustration of S204 is the same to FIGS. 4c and 4C of the first embodiment, and the illustration of S206 is the same to FIGS. 4d and 4D of the first embodiment.

After the step of S206, referring to FIGS. 7a and 7A, the method of the second embodiment further comprises: respectively covering and filling a plurality of longitudinal frame layers 4' on the substrate body 10, on the package colloids 30, and between each two longitudinal and adjacent package colloids 30 via a third mold unit M3 (S208).

The third mold unit M3 is composed of a third upper mold M31 and a third lower mold M32 for supporting the substrate body 10. The third upper mold M31 has a plurality of third channels M310 corresponding to the longitudinal LED chip rows 2. Each third channel M310 has a height the same to that of each corresponding package colloid 30 and each third channel M310 has a width larger than that of each corresponding package colloid 30.

Finally, referring to FIGS. 7a, 7b, and 7B, the method of the second embodiment further comprises: transversely cutting the longitudinal frame layers 4', the package colloids 30 and the substrate body 10 along a line between each two adjacent and longitudinal LED chips 20 to form a plurality of light bars L2, and each package colloid 30 being cut into two half package colloids 300, each half package colloid 300 having a half cambered colloid surface 300S and a rough light-emitting colloid surface 301S formed in front of its cambered colloid surface 300S, and each light bar L2 having a frame layer 40' for exposing the rough light-emitting colloid surfaces 301S of the half package colloids 300 (S210). Moreover, each frame layer 40' can be an opaque frame body such as a white frame body.

Figure 8A:
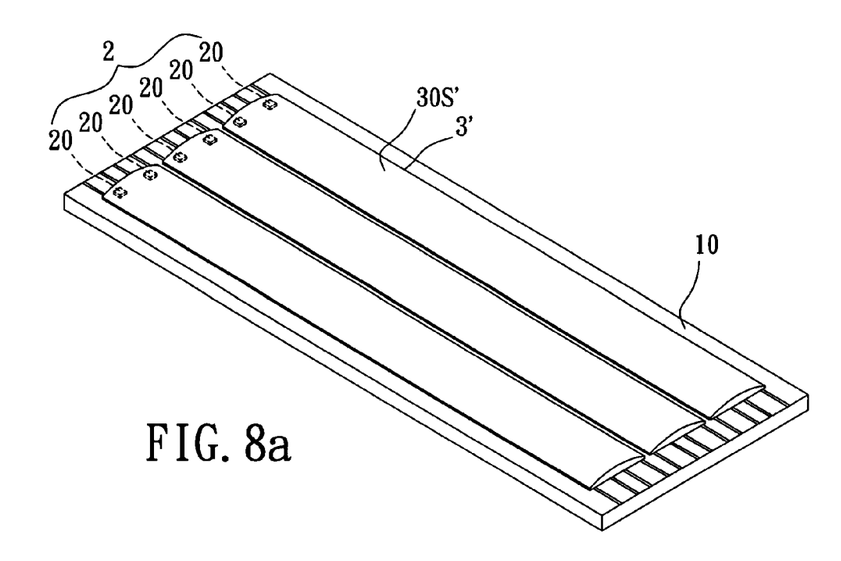
FIG. 8a is a perspective, schematic diagrams of a packaging process according to the third embodiment of present invention.

Referring to FIGS. 8a and 8A, the third embodiment of the present invention provides a method for making an LED chip package structure with high-efficiency light emission by rough surfaces. The difference between the third embodiment and the first embodiment (or second embodiment) is that "transversely cutting the longitudinal package colloids 3 along a line between each two adjacent and longitudinal LED chips 20" is changed into "longitudinally cutting the longitudinal package colloids 3' along a line between each two adjacent and transverse LED chips 20".

The fourth mold unit M4 is composed of a fourth upper mold M41 and a fourth lower mold M42 for supporting the substrate body 10. The difference between the fourth mold unit M4 and the first mold unit M1 is that each fourth channel M410 has a cambered mold surface 30S' formed on its top surface. Hence, the longitudinal package colloids 3' are transversely covering the longitudinal LED chips 2.

Figure 9:
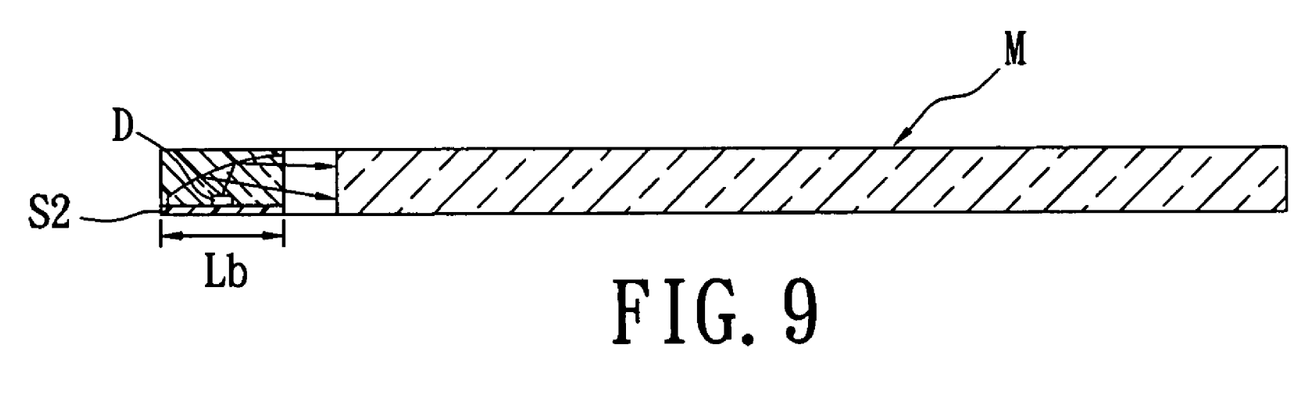
FIG. 9 is a schematic view of an LED chip package structure used to generate lateral projected light according to the present invention.

Referring to FIG. 9, when an LED chip D is used to generate lateral projected light as a lateral light source that is applied to a light-guiding board M of a monitor of a notebook, a length Lb of a base S2 can be increased according to heat-dissipation requirement (that is very different from the prior art). In other words, the length Lb of the base S2 can be increased, the LED chip D can get good heat-dissipating effect. Hence, the LED chip D can not be damaged easily due to overheat.

In conclusion, because the series of light-generating areas is continuous, no dark bands are produced between each two LED chips and no light decay in the present invention. Furthermore, because the LED chips are arranged on a substrate body via an adhesive or a hot pressing method, the process for the LED chip package structure is simple and less time is needed for the manufacturing process. Moreover, the LED chip package structure of the present can be used in vertical state due to the special hot pressing method. Hence, the LED chip package structure of the present invention not only has a good heat-dissipating effect, but also can be applied to a thin casing.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An LED chip package structure, comprising:
    a substrate unit having an opaque substrate body, and a positive electrode trace and a negative electrode trace respectively formed on the opaque substrate body, wherein the opaque substrate body has a cutting surface formed on a lateral side thereof;
    a light-emitting unit having a plurality of LED chips arranged on the opaque substrate body, wherein each LED chip has a positive electrode side and a negative electrode side respectively and electrically connected with the positive electrode trace and the negative electrode trace of the substrate unit; and
    a package colloid unit having a plurality of half package colloids for respectively covering the LED chips, wherein each half package colloid has a half cambered colloid surface and a rough light-emitting colloid surface respectively formed on a top surface and a lateral surface thereof, the half cambered colloid surface is extended upwardly and forwardly from a top surface of the opaque substrate body and the rough light-emitting colloid surface is extended downwardly from a top end of the half cambered colloid surface to the top surface of the opaque substrate body, and each rough light-emitting colloid surface is substantially flush with the cutting surface of the opaque substrate.

2. The LED chip package structure as claimed in claim 1, wherein the opaque substrate body has a metal layer and a Bakelite layer formed on the metal layer, and both the positive electrode trace and the negative electrode trace are aluminum circuits or silver circuits.

3. The LED chip package structure as claimed in claim 1, wherein the positive electrode side and the negative electrode side of each LED chip are respectively and electrically connected with the positive electrode trace and the negative electrode trace of the substrate unit via two corresponding leading wires.

4. The LED chip package structure as claimed in claim 1, wherein the positive electrode side and the negative electrode side of each LED chip are respectively and electrically connected with the positive electrode trace and the negative electrode trace of the substrate unit via a plurality of corresponding solder balls.

5. The LED chip package structure as claimed in claim 1, wherein the LED chips are arranged on the opaque substrate body of the substrate unit along a straight line.

6. The LED chip package structure as claimed in claim 1, wherein the LED chips are arranged on the opaque substrate body of the substrate unit along a plurality of straight lines.

7. The LED chip package structure as claimed in claim 1, wherein each half package colloid is a fluorescent resin that is formed by mixing silicone with fluorescent powders.

8. The LED chip package structure as claimed in claim 1, wherein each half package colloid is a fluorescent resin that is formed by mixing epoxy with fluorescent powders.

9. The LED chip package structure as claimed in claim 1, further comprising a frame unit having an opaque frame layer formed on the opaque substrate body to cover one part of each half package colloid, wherein only the rough light-emitting colloid surface of each half package colloid is exposed, and the half cambered colloid surface and other outer surfaces of each half package colloid are covered by the opaque frame layer.

10. The LED chip package structure as claimed in claim 9, wherein one part of light beams generated by the LED chips are directly projected outside from the rough light-emitting colloid surface of each half package colloid and the other light beams generated by the LED chips are reflected by an inner surface of the opaque frame layer and then projected outside from the rough light-emitting colloid surface of each half package colloid.

11. The LED chip package structure as claimed in claim 1, further comprising a frame unit having a plurality of opaque frame bodies formed on the opaque substrate body to respectively cover the half package colloids, wherein the opaque frame bodies are separated from each other, and only the rough light-emitting colloid surface of each half package colloid is exposed, and each half cambered colloid surface and other outer surfaces of each half package colloid are covered by the opaque frame bodies.

12. The LED chip package structure as claimed in claim 11, wherein one part of light beams generated by the LED chips are directly projected outside from the rough light-emitting colloid surfaces of the half package colloids and the other light beams generated by the LED chips are reflected by inner surfaces of the opaque frame bodies and then projected outside from the rough light-emitting colloid surfaces of the half package colloids.

\* \* \* \* \*